US007412477B1

(12) United States Patent
Jennings (10) Patent No.: US 7,412,477 B1
(45) Date of Patent: Aug. 12, 2008

(54) INTERPOLATION OF SIGNALS FROM A DELAY LINE

(75) Inventor: John K. Jennings, Glenageary (IE)

(73) Assignee: Xilinx, Inc., San Jose, CA (US)

( * ) Notice: Subject to any disclaimer, the term of this patent is extended or adjusted under 35 U.S.C. 154(b) by 790 days.

(21) Appl. No.: 10/681,508

(22) Filed: Oct. 7, 2003

(51) Int. Cl.
   G06G 7/16       (2006.01)
   H03H 11/16      (2006.01)
(52) U.S. Cl. .................. 708/845; 708/290; 327/231
(58) Field of Classification Search ............. 708/290, 708/313, 3, 845; 327/231, 233
   See application file for complete search history.

(56) References Cited

U.S. PATENT DOCUMENTS

| 6,204,733 | B1* | 3/2001 | Cai ............... 331/108 B |
| 6,396,360 | B1* | 5/2002 | Cai ............... 331/108 B |
| 2002/0021775 | A1* | 2/2002 | Dietl et al. ............ 375/354 |
| 2002/0113637 | A1* | 8/2002 | Huang et al. ........... 327/258 |

OTHER PUBLICATIONS

Lee, Thomas H. et al.; "A 2.5 V CMOS Delay-Locked Loop for an 18 Mbit, 500 Megabytes/s DRAM"; IEEE Journal of Solid-State Circuits, vol. 29, No. 12, Dec. 1994; pp. 1491-1496.
Maneatis, John G.; "Low-Jitter Process-Independent DLL and PLL Based on Self-Biased Techniques"; IEEE Journal of Solid-State Circuits, vol. 31, No. 11, Nov. 1996; pp. 1723-1732.
Sidiropoulos, Stafanos; "A Semidigital Dual Delay-Locked Loop"; IEEE Journal of Solid-State Circuits, vol. 32, No. 11, Nov. 1997; pp. 1683-1692.
Bult, Klaas et al.; An Embedded 240-mW 10-b 50-MS/s CMOS ADC in 1-mm$^2$; IEEE Journal of Solid-State Circuits, vol. 32, No. 12, Dec. 1997, pp. 1887-1895.
Chou, ju-Ming et al.; "A 125MHz 8b Digital-to-Phase Converter"; ISSCC 2003 / Session 24 / Clock Generation / Paper 24.8; two pages.

* cited by examiner

*Primary Examiner*—Chuong D Ngo
(74) *Attorney, Agent, or Firm*—E. Eric Webostad; Michael R. Hardaway (57) ABSTRACT

Method and apparatus for interpolation of signals from a delay line is described. An input signal is obtained from which progressively delayed input signals are generated from the input signal. Two of the progressively delayed input signals are accessed and interpolated to provide a phase-adjusted signal.

16 Claims, 8 Drawing Sheets

INTERPOLATION OF SIGNALS FROM A DELAY LINE

FIELD OF THE INVENTION

One or more aspects of the invention relate generally to interpolation of signals from a delay line.

BACKGROUND OF THE INVENTION

It is well known to receive a timing signal to an integrated circuit, and then synchronize phase to such a received timing signal. A conventional approach to determine phase of the timing signal is to receive the timing signal to a coarse-grain synchronization circuit having a first range to obtain a general indication of phase of such a timing signal. Output of the coarse-grain synchronization circuit along with the timing signal is provided to a fine-grain synchronization circuit having a second range to obtain a more precise indication of phase of such a timing signal. Though the first range is broader than the second range, the second range has smaller increments than the first range.

A coarse-grain phase detection stage may be implemented with a delay line, which is sometimes referred to as the "main" delay line, and a fine-grain phase detection stage may be implemented with a delay line, which is sometime referred to as the "trim" delay line. Such delay lines may be controlled with or part of a delay-locked loop ("DLL"). Notably, fine-grain phase detection stages not having delay lines may be used, such as a phase-locked loop ("PLL"). Unfortunately, delay lines, even those with incremental steps, tend to consume a significant amount of area and power on an integrated circuit die, and PLLS with sufficient granularity and jitter insensitivity tend to be costly.

Accordingly, it would be desirable to provide fine-grain phase detection overcoming one or more limitations of area, power and cost associated with a separate trim delay line or a PLL.

SUMMARY OF THE INVENTION

An aspect of the invention is a phase adjustment circuit. The phase adjustment circuit comprises: a delay line having taps for providing progressively delayed samples of an input signal; selection circuitry coupled to receive the progressively delayed samples and to receive control signaling to select two samples of the progressively delayed samples; and an interpolator coupled to receive the two samples selected and configured to provide a phase-adjusted signal. The phase-adjusted signal is an interpolation of the two samples selected.

Another aspect of the invention is another phase adjustment circuit. The other phase adjustment circuit comprises: a delay line having taps for providing progressively delayed samples of an input signal; interpolators coupled to receive respective pairs of the progressively delayed samples and configured to provide adjusted phase signals; and selection circuitry coupled to receive the adjusted phase signals and configured to select a phase-adjusted signal of the adjusted phase signals responsive to a control signal. The adjusted phase signals are respective interpolations of the pairs of the progressively delayed samples.

An aspect of the invention is a method for phase adjustment. The method comprises: obtaining an input signal; generating progressively delayed input signals from the input signal; accessing two of the progressively delayed input signals; and interpolating the two of the progressively delayed input signals to provide a phase-adjusted signal.

Another aspect of the invention is another method for phase adjustment. The other method comprises: obtaining an input signal; generating progressively delayed input signals from the input signal; accessing pairs of the progressively delayed input signals; interpolating the pairs of the progressively delayed input signals to provide phase-adjusted signals; and selecting a phase-adjusted signal of the phase-adjusted signals as an interpolated output.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1A:
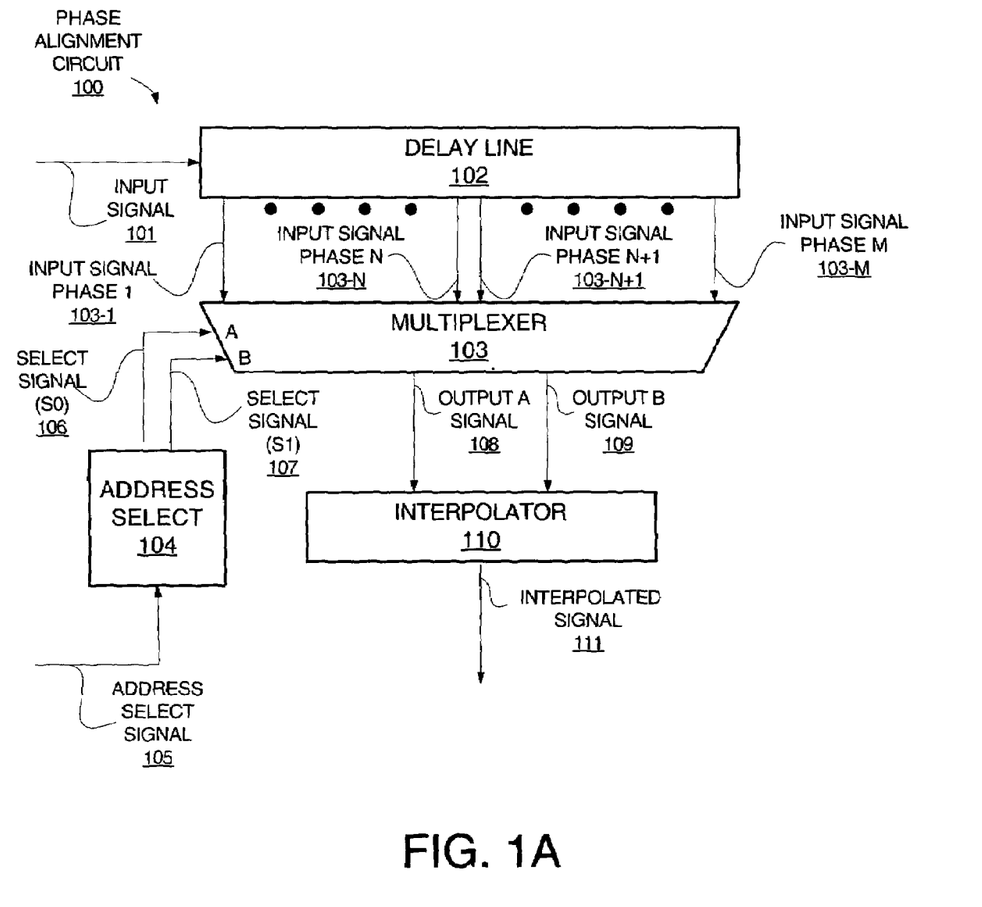
FIG. 1A is a block diagram depicting an exemplary embodiment of a phase alignment circuit.

FIG. 1A is a block diagram depicting an exemplary embodiment of a phase alignment circuit 100. Phase alignment circuit 100 includes a delay line 102, a multiplexer 103, an address selector 104 and interpolator 110. Delay line 102 has multiple taps for incrementally delaying a received input signal 101 to provide multiple "phase-shifted" input signal 103-1 through 103-M, for M a positive integer. Input signal 101 may be a timing signal, such as a clock signal or other periodic pulsing signal. Before and after input signal 101 passes through delays of delay line 102, taps of delay line may be used to output input signal 102 with progressive delays, and thus progressive phase shifts, namely, "phase-shifted" input signal 103-1 through 103-M. Notably, "phase-shifted" input signal 103-1 may be prior to any induced delay, and thus "phase-shifted" input signal 103-1 would have zero phase delay or shift relative to input signal 101 for purposes of timing circuit 100. Alternatively, phase-shifted input signal 103-1 may pass through one or more delays of delay line 102. Continuing the example, at the end of delay line 102, phase-shifted input signal 103-M could have passed through all or a subset of all the delays of delay line 102. Accordingly, a first phase-shifted input signal 103-1 of delay line 102 is indicated as being for a first phase delay ("Phase 1"), and a last phase-shifted input signal 103-M of delay line 102 is indicated as being for an Mth phase delay ("Phase N").

Phase-shifted input signals 103-1 through 103-M are provided as input to multiplexer 103. Control signals, namely, select signal (S0) 106 and select signal (S1) 107, are input as A and B selects, respectively, to multiplexer 103. Select signals 106 and 107 are output from address select 104 responsive to an address select signal 105 input to address select 104. Multiplexer 103 is an A-B multiplexer, where output A and B signals 108 and 109, respectively, are selected from phase-shifted input signals 103-1 through 103-M. For this example, it is assumed that phase-shifted input signal 103-N of phase-shift N is selected for output A signal 108 responsive to select signal 106. Furthermore, for this example, it is assumed that phase-shifted input signal 103-N+1, namely, a phase-shifted input signal 103 immediately following phase-shifted input signal 103-N+1, is selected for output B signal 109 responsive to select signal 107. Address select 104 may select phase-shifted input signals 103-N and 103-N+1 by incrementing, or decrementing, address information provided via address select signal 105.

Notably, other than providing at least two phase-shifted input signals 103 having some phase separation to interpolator 110, the remainder of timing circuit 100 may assume many configurations other the exemplary embodiment. For example, rather than an A-B multiplexer, separate multiplexers may be used. Additionally, rather than having a phase-shifted input signal and an immediately following phase-shifted input signal, one or more phase-shifted input signals may be skipped, such as providing phase-shifted input signals 103-N and 103-N+2 or 103-N and 103-N+3, for example, to interpolator 110. Additionally, a DLL, not shown, may be used to control delay line 102, and delay line 102 may form a portion of such a DLL. Furthermore, a DLL or PLL may be used to provide address select signal 105, namely, to provide a sufficient indication of phase of input signal 101 for interpolation to proceed.

Interpolator 110 receives output A signal 108 and output B signal 109 and in response provides an interpolation of those signals, namely, interpolated signal 111. Interpolated signal 111 in this example has a phase shift relative to input signal 101. Notably, it is possible that a phase-shifted input signal 103 selected for interpolation is phase aligned with input signal 101, for example where interpolated signal 111 has a phase shift of either Phase N or Phase N+1. However, it is assumed that interpolated signal 111 has phase shift that is between Phase N and Phase N+1.

Thus, it should be understood that interpolated signal 111 is at least substantially phase aligned with input signal 101. Furthermore, it should be appreciated that interpolation can yield a substantially phase aligned output without having a trim unit, such as a DLL, PLL or another delay line.

Figure 1B:
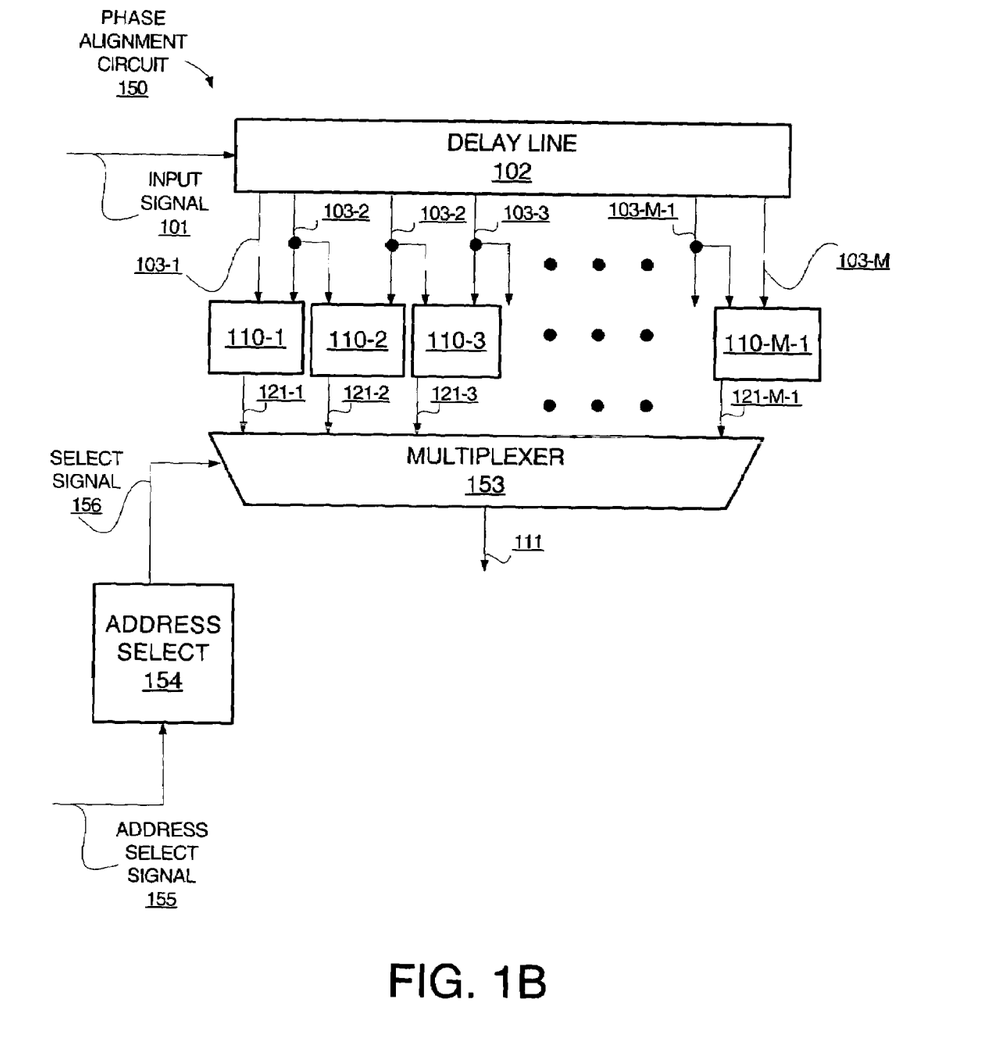
FIG. 1B is a block diagram depicting another exemplary embodiment of a phase alignment circuit.

Additionally, it should be understood that rather than having a single interpolator in communication with a select circuit, such as multiplexer 103, respective interpolators 110 may be disposed to receive pairs of input signals 103, and an output of an interpolator 110 is selected. FIG. 1B is a block diagram depicting an exemplary embodiment of a phase alignment circuit 150. Phase alignment circuit 150 includes delay line 102, interpolators 110-1 through 110-M−1, multiplexer 153 and address select 154.

Input signal 101 is provided to delay line 102, which outputs phase-shifted input signals 103-1 through 103-H. Phase-shifted input signals 103-1 through 103-M are provided to interpolators 110-1 through 110-M−1 in respective adjacent pairs. For example, phase-shifted input signals 103-1 and 103-2 are provided to interpolator 110-1 which produces an interpolated signal 121-1; and phase-shifted input signals 103-2 and 103-3 are provided to interpolator 110-2 which produces an interpolated signal 121-2. This continues down the delay line until phase-shifted input signals 103-M−1 and 103-M are provided to interpolator 110-M−1 which produces an interpolated signal 121-M−1. Notably, as described in additional detail below, rather than a single phase-adjusted or interpolated signal output from respective interpolators 110-1 through 110-X−1, multiple outputs from each interpolator may be provided for providing different percentages of interpolation. However, for clarity, a single output from each interpolator 110-1 through 110-M−1 is described.

Interpolated signals 121-1 through 121-M−1 are provided to multiplexer 153. An address select signal 155 is provided to address select 154 to generate select signal 156. Select signal 156 is provided to multiplexer 153 to select an interpolated signal from interpolated signals 121-1 through 121-M−1 responsive to address select signal 155. Such a selected signal is output from multiplexer 153 as interpolated signal 111. Notably, as multiple outputs from an interpolator may be provided, in such an embodiment such multiple outputs form signals from which multiplexer 153 may be used to select a phase-adjusted signal.

Notably, signals to be interpolated do not have to come from a delay line. For example, output signals from separate discrete circuits may be used to generate an intermediate timing signal. Furthermore, it should be appreciated that more than two input signals may be provided to an interpolator. For example, four approximately equivalent resistance resistors may be connected from four separate input signals to a common output. The output point of such a network of resistors will produce a signal which is the mean value of the input signal. Thus, it should be appreciated that additional input signals allow for weighted averaging, which may be beneficial to mitigate against component variation. Notably, to provide a smoother output signal, in contrast to a stepwise output signal, generally the transition of input signals to be interpolated should overlap in time.

Figure 2A:
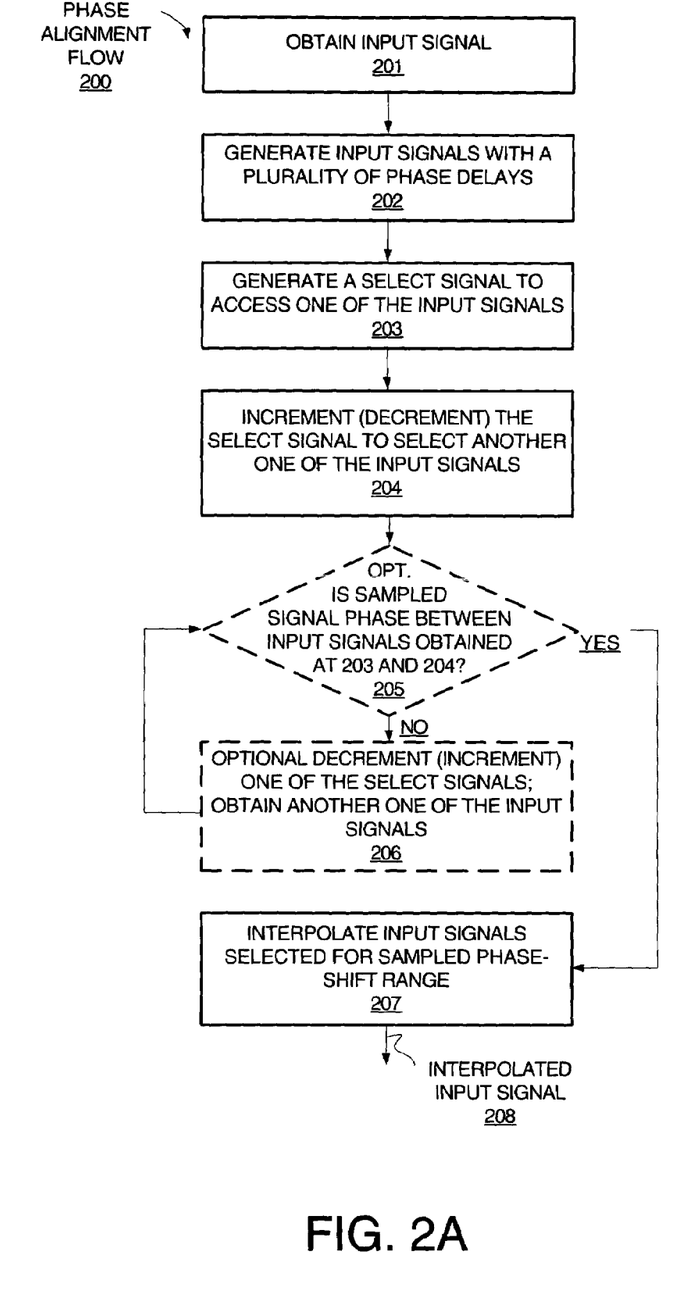
FIG. 2A is a flow diagram depicting an exemplary embodiment of a phase alignment flow.

Furthermore, it is not absolutely necessary to create a phase alignment circuit to implement above-described interpolation. For example, above-described interpolation may be implemented in software, for example for circuit simulation. Accordingly, FIG. 2A is a flow diagram depicting an exemplary embodiment of a phase alignment flow 200. At 201, an input signal is obtained. Such an input signal may be a timing signal, such as a clock signal or other periodic pulsing signal.

At 202, from an input signal obtained at 201, input signals progressively delayed with respect to one another are generated. At 203, a select signal is generated to select one of the progressively delayed input signals at least proximal in phase with the input signal obtained at 201. At 204, the select signal is incremented or decremented to select another one of the progressively delayed input signals at least proximal in phase with the input signal obtained at 201.

Optionally, at 205, a check may be made to determine if phase of the input signal obtained at 201 is between the input signals selected at 203 and 204, optionally including phase-aligned with either of the input signals selected at 203 and 204. In response to phase of the input signal obtained at 201 not being between the input signals selected at 203 and 204 at 205, at 206 one of the input signals selected at 203 and 204 may be incremented, or decremented, and another of the input signals may be obtained at 206 to sample a different phase-shift range. If at 205, phase of the input signal obtained at 201 lies within or on a sampled phase-shift range, then interpolation of the input signals selected is done at 207.

At 207, input signals selected, having a sampled phase-shift range for the input signal obtained at 201, are interpolated. Output from interpolation at 207 is an interpolated input signal 208 that is at least substantially phase aligned with the input signal obtained at 201.

Figure 2B:
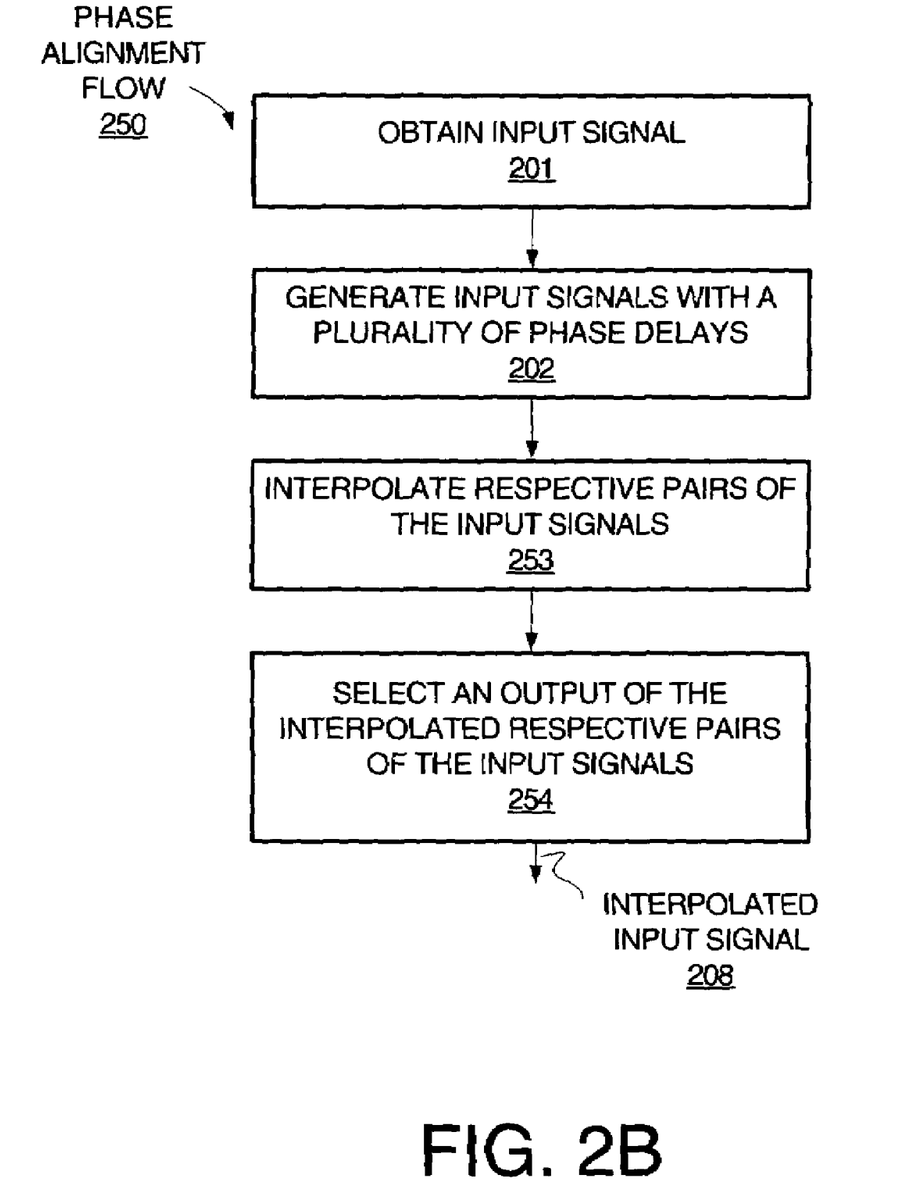
FIG. 2B is a flow diagram depicting another exemplary embodiment of a phase alignment flow.

FIG. 2B is a flow diagram depicting an exemplary embodiment of a phase alignment flow 250. A portion of phase alignment flow 250 is the same as phase alignment flow 200, and thus is not repeated. At 253, respective pairs of input signals generated at 202 are interpolated. Notably, such respective pairs may or may not be sequentially adjacent. This interpolation produces respective interpolated outputs. At 254, an output of the respective interpolated outputs generated at 253 is selected. This selected output is an interpolation of the input signal obtained at 201, namely, interpolated input signal 208. Interpolated input signal 208 is substantially phase aligned with the input signal obtained at 201.

Figure 3A:
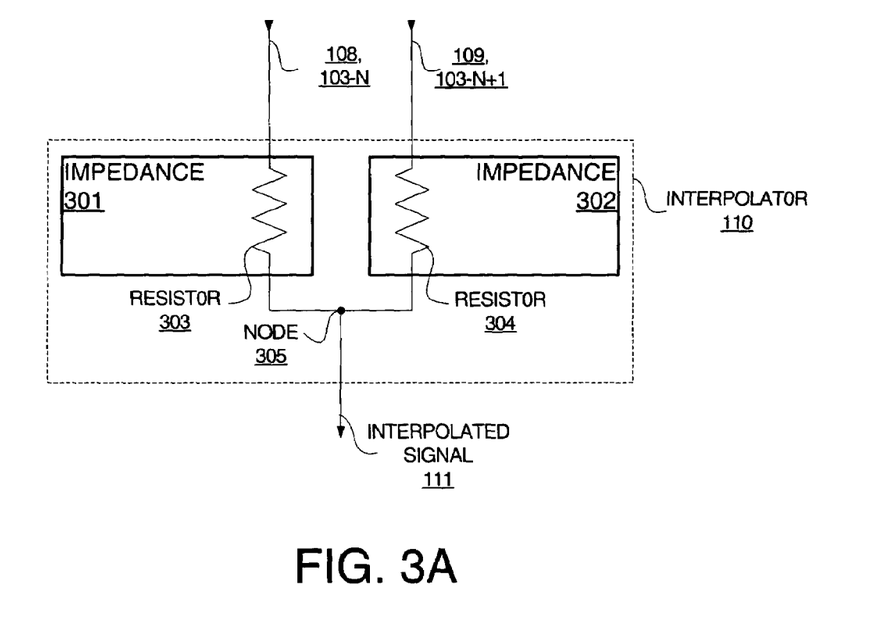
FIG. 3A is a circuit diagram depicting an exemplary embodiment of interpolator.

However, interpolation embodied in hardware is done with circuits, as described with respect to FIG. 3A, where there is shown a circuit diagram depicting an exemplary embodiment of interpolator 110. In this exemplary embodiment of an interpolator 110, either output signals 108 and 109, or phase-shifted input signals 103-N and 103-N+1, are respectively provided to impedances 301 and 302.

Impedances 301 and 302 may be substantially equivalent for a substantially symmetric interpolation or may be different for a biased interpolation. Impedances 301 and 302 are illustratively show as respective resistors 303 and 304. By having respective resistors in series to receive respective phase separated adjacent edges of output signals 108 and 109, a third signal, namely, interpolated signal 111, is produced at a common node 305 of resistors 303 and 304. Interpolated signal 111 will have an edge, which occurs at an intermediate timing instant, unless phase aligned, between input edges of either output signals 108 and 109 or phase-shifted input signals 103-N and 103-N+1.

Notably, implementations of impedances 301 and 302 may be provided by other passive elements, other than single respective resistors. For example, other passive elements may include capacitors or inductors that may be used instead of resistors, or any combination of capacitors, inductors and resistors may be used. Furthermore, in an alternative embodiment, resistive, inductive, or capacitive networks may be instantiated using transistors configured to operate in a non-saturation state.

Figure 3B:
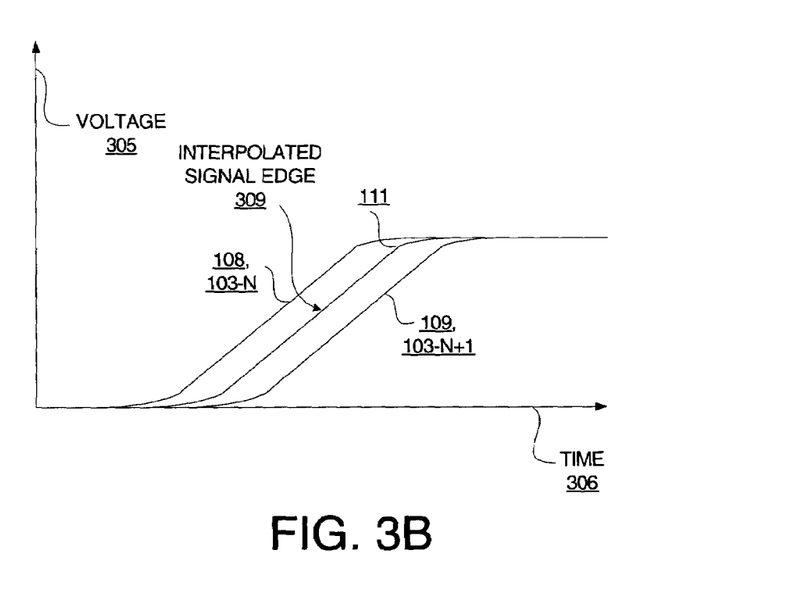
FIG. 3B is a signal diagram depicting an exemplary embodiment of an interpolated signal.

FIG. 3B is a signal diagram depicting an exemplary embodiment of an interpolated signal 111 along time axis 306 and voltage axis 305. As shown, interpolated signal 111 has an interpolated signal edge 309 disposed between input edges of either output signals 108 and 109 or phase-shifted input signals 103-N and 103-N+1. Notably, more than one edge, and thus more than one interpolated signal may be generated.

Figure 3C:
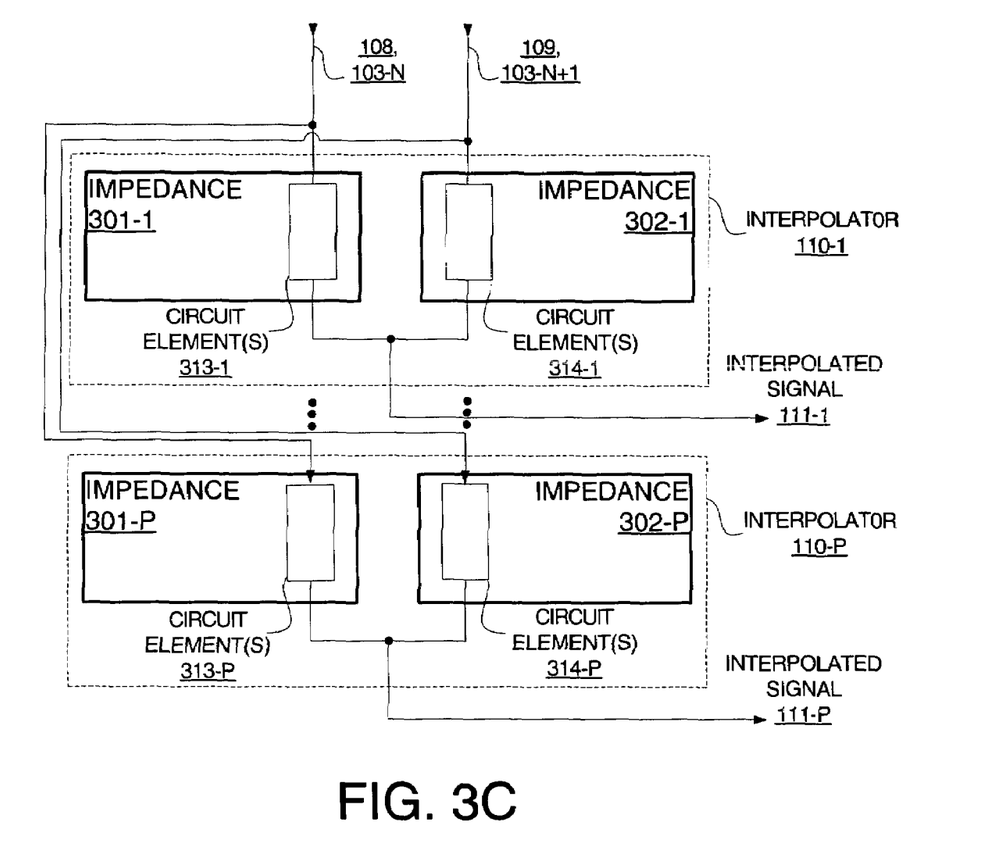
FIG. 3C is a block diagram depicting an exemplary embodiment of interpolators.

FIG. 3C is a block diagram depicting an exemplary embodiment of interpolators 110-1 through 110-P configured for providing respective interpolated signals 111-1 through 111-P. Each interpolator 110 includes one or more circuit element(s) having respective impedances 301 and 302.

For example, interpolator 310-1 includes impedances 301-1 and 302-1 for respectively receiving either output signals 108 and 109 or phase-shifted input signals 103-N and 103-N+1. Impedances 301-1 and 302-2 respectively include one or more circuit element(s) 313-1 and 314-1. At a common output node of impedances 301-1 and 302-2 an interpolated signal 111-1 is tapped. For example, interpolator 310-P, for P a positive integer, includes impedances 301-P and 302-P for respectively receiving either output signals 108 and 109 or phase-shifted input signals 103-N and 103-N+1. Impedances 301-P and 302-P respectively include one or more circuit element(s) 313-P and 314-P. At a common output node of impedances 301-P and 302-P an interpolated signal 111-P is tapped.

Figure 3D:
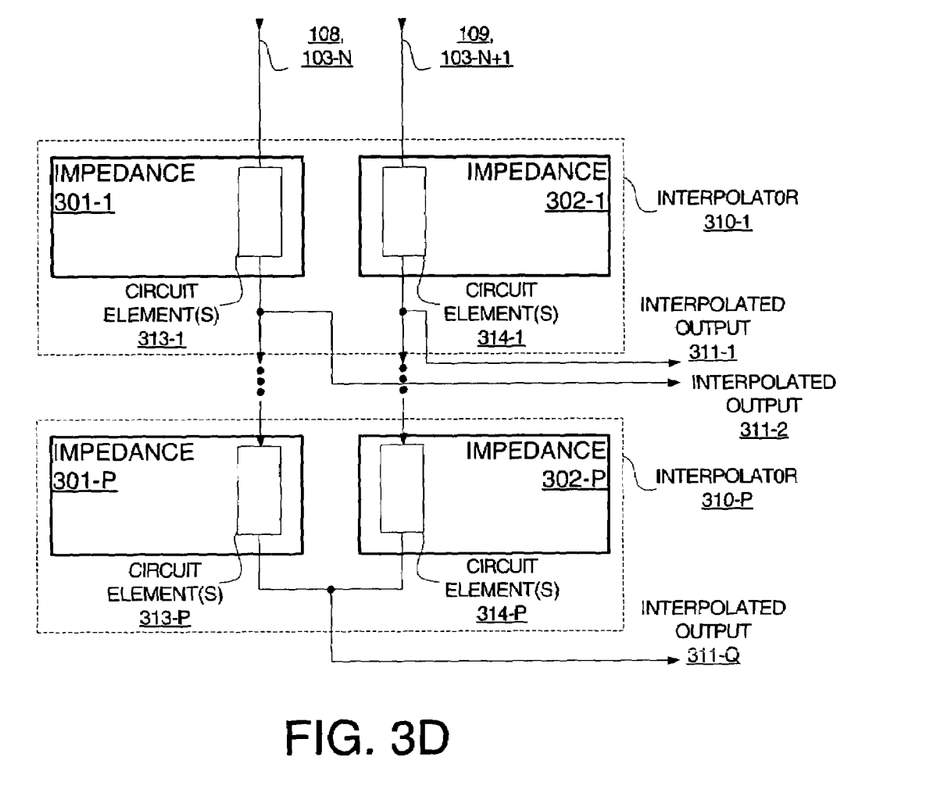
FIG. 3D is a block diagram depicting another exemplary embodiment of interpolators.
Figure 3E:
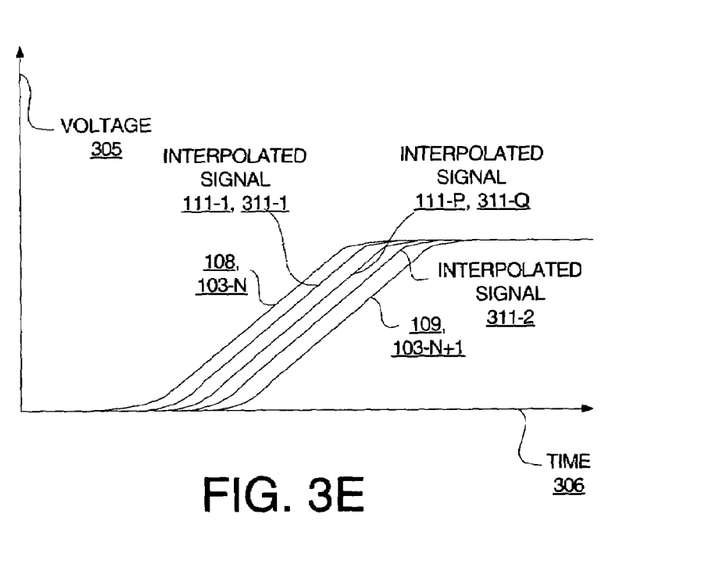
FIG. 3E is a signal diagram depicting an exemplary embodiment of interpolated signals.

FIG. 3E is a signal diagram depicting an exemplary embodiment of interpolated signals 111-1 and 111-P along time axis 306 and voltage axis 305. As shown, by having different impedances 301 and 302 among interpolator stages, interpolated signals 111-1 and 111-P produce spaced apart signal edges disposed between input edges of either output signals 108 and 109 or phase-shifted input signals 103-N and 103-N+1. Notably, spacing among interpolated signal edges is selectable by impedances used, and thus even or uneven spacing among interpolated signal edges may result.

Additionally, rather than or in combination with a parallel output arrangement of FIG. 3C, interpolation stages may be coupled in series. FIG. 3D is a block diagram depicting an exemplary embodiment of interpolators 110-1 through 110-P configured in series for providing respective interpolated signals 311-1 through 311-Q. For example, two stages, namely, for P equal to 2, may be used to provide three interpolated phases, namely, Q equal to 3. Thus, there are interpolated outputs 311-1, 311-2 and 311-3. Each of these interpolated outputs may be for a different percentage. For example, interpolated outputs 311-1, 311-2 and 311-3 may respectively be approximately 25, 50 and 75 percent interpolations between inputs 108 and 109, or 103-N and 103-N+1, as illustrative shown in FIG. 3E.

Figure 4:
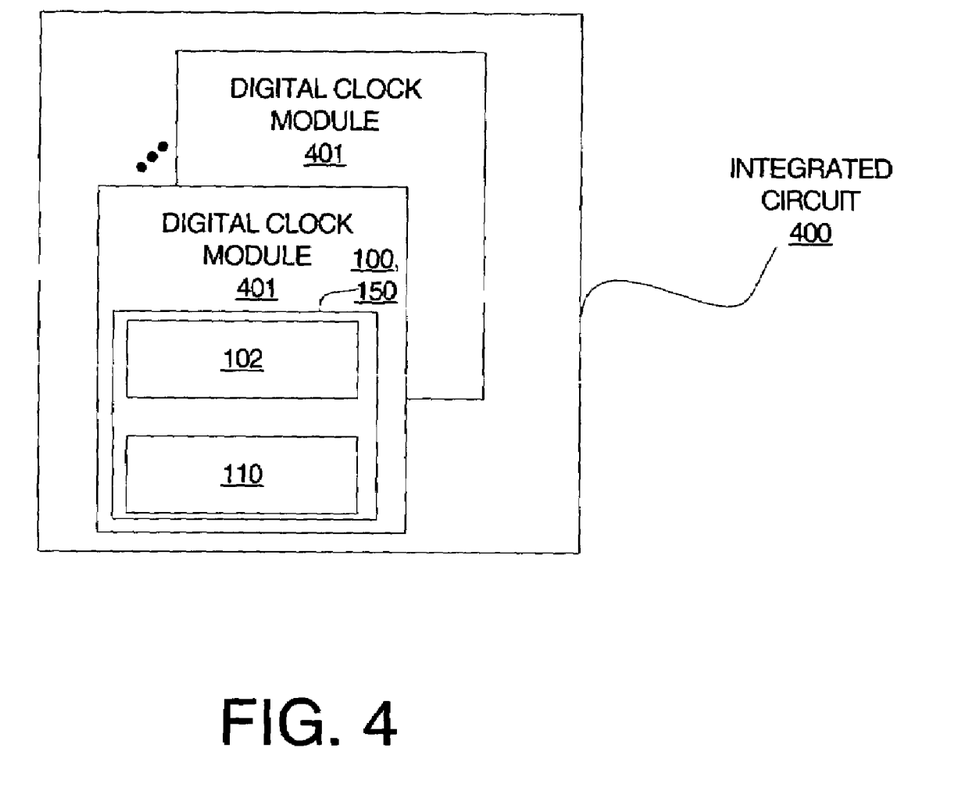
FIG. 4 is a block diagram depicting an exemplary embodiment of an integrated circuit.

FIG. 4 is a block diagram depicting an exemplary embodiment of an integrated circuit 400. Integrated circuit 400 includes a digital clock module 401. Digital clock module 401 includes a delay line 102 coupled to one or more interpolators 110, such as in phase alignment circuits 100 or 150. Thus, an input signal may be provided to integrated circuit 400 for phase adjustment or alignment, as described herein. Alternatively or in addition to phase adjustment or alignment to an external input signal, integrated circuit may include a plurality of digital clock modules 401 for phase adjustment or alignment of signals internal to integrated circuit 400.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A phase adjustment circuit, comprising:
a delay line, the delay line having taps for providing progressively delayed samples of an input signal;
selection circuitry coupled to receive the progressively delayed samples and to receive control signaling to select two samples of the progressively delayed samples; and
an interpolator, consisting essentially of passive elements, coupled to receive the two samples selected and configured to provide a phase-adjusted signal, the phase-adjusted signal being an interpolation of the two samples selected, wherein the interpolator comprises:
respective impedances coupled together at a common node for outputting the phase-adjusted signal wherein an impedance of the respective impedances is selected from a group consisting of a resistor, an inductor, a capacitor and any combination thereof;
independent impedances coupled to respective output nodes for providing respective interpolations of the two samples selected; and a set of impedances coupled to the output nodes and to a common node, the common node for outputting a respective interpolation of the two samples selected.

2. The phase adjustment circuit, according to claim 1, further comprising an address select coupled to the selection circuitry, the address select configured to provide the control signaling responsive to an address.

3. The phase adjustment circuit, according to claim 2, wherein the address select is configured to provide a first select signal and a second select signal for the control signaling.

4. The phase adjustment circuit, according to claim 3, wherein the first select signal is for selecting a first sample of the two samples, and wherein the second select signal is for selecting a second sample of the two samples.

5. The phase adjustment circuit, according to claim 4, wherein the first sample and the second sample are associated with two sequentially adjacent taps of the delay line.

6. The phase adjustment circuit, according to claim 1, wherein the interpolator comprises sets of impedances coupled in series at respective common output nodes, the common nodes for outputting the phase-adjusted signals.

7. The phase adjustment circuit, according to claim 1, wherein the respective interpolations and the respective interpolation in combination provide approximately 25, 50 and 75 percent interpolated phases.

8. The phase adjustment circuit, according to claim 7, wherein the phase-adjusted signal is one of the interpolated phases.

9. A method for phase adjustment, comprising:
obtaining an input signal;
generating progressively delayed input signals from the input signal;
using a selector, accessing two of the progressively delayed input signals; and
using only passive elements, interpolating the two of the progressively delayed input signals to provide a phase-adjusted signal,
wherein the interpolating comprises coupling sets of impedances together at a common node for outputting the phase-adjusted signal and wherein an impedance of the respective impedances is selected from a group consisting of a resistor, an inductor, a capacitor and any combination thereof;
independent impedances coupled to respective output nodes for providing respective interpolations of the two samples selected; and
a set of impedances coupled to the output nodes and to a common node, the common node for outputting a respective interpolation of the two samples selected.

10. The method, according to claim 9, wherein the phase-adjusted signal being at least approximately phase aligned with the input signal.

11. The method, according to claim 10, wherein the accessing comprises:
selecting a progressively delayed input signal of the progressively delayed input signals responsive to an address; and
incrementing the address to select another progressively delayed input signal.

12. The method, according to claim 11, further comprising:
determining whether phase of the input signal is between the progressively delayed input signal and the other progressively delayed input signal; and
responsive to the phase of the input signal not being between the progressively delayed input signal and the other progressively delayed input signal, adjusting the address to select yet another progressively delayed input signal.

13. An integrated circuit, comprising:
a digital clock module, the digital clock module including:
delay line means for providing progressively delayed samples of an input signal;
selection circuitry means for receiving the progressively delayed samples and for receiving control signaling to select two samples of the progressively delayed samples; and
interpolator means for receiving the two samples selected and configured to provide a phase-adjusted signal, the phase-adjusted signal being an interpolation of the two samples selected, wherein the interpolator means comprises:
respective impedances coupled together at a common node for outputting the phase-adjusted signal and wherein an impedance of the respective impedances is selected from a group consisting of a resistor, an inductor, a capacitor and any combination thereof;
independent impedances coupled to respective output nodes for providing respective interpolations of the two samples selected; and
a set of impedances coupled to the output nodes and to a common node, the common node for outputting a respective interpolation of the two samples selected.

14. The integrated circuit, according to claim 13, wherein the selection circuitry means is a multiplexer.

15. Phase adjustment circuitry, comprising:
discrete circuits configured to provide respective output signals; and
an interpolator coupled to receive the output signals and configured to provide a phase-adjusted signal, the phase-adjusted signal being an interpolation of the output signals without use of phase inversion of the output signals; wherein the interpolator comprises:
respective impedances coupled together at a common node for outputting the phase-adjusted signal and wherein an impedance of the respective impedances is selected from a group consisting of a resistor, an inductor, a capacitor and any combination thereof;
independent impedances coupled to respective output nodes for providing respective interpolations of the two samples selected; and
a set of impedances coupled to the output nodes and to a common node, the common node for outputting a respective interpolation of the two samples selected.

16. The phase adjustment circuitry, according to claim 15, wherein there are at least two of the output signals.

* * * * *